United States Patent
Yano et al.

(10) Patent No.: US 8,242,947 B2
(45) Date of Patent: Aug. 14, 2012

(54) REMOTE CONTROL APPARATUS USING ELECTROSTATIC SENSOR

(75) Inventors: Shigehide Yano, Kyoto (JP); Hiroshi Yamashita, Kyoto (JP); Nobutaka Itakura, Kyoto (JP)

(73) Assignee: Rohm Co., Ltd. (JP)

( * ) Notice: Subject to any disclaimer, the term of this patent is extended or adjusted under 35 U.S.C. 154(b) by 753 days.

(21) Appl. No.: 12/368,052

(22) Filed: Feb. 9, 2009

(65) Prior Publication Data
US 2010/0171646 A1 Jul. 8, 2010

(30) Foreign Application Priority Data

Feb. 8, 2008 (JP) ................... 2008-029601
Feb. 8, 2008 (JP) ................... 2008-029606
Jan. 13, 2009 (JP) ................... 2009-004424

(51) Int. Cl.
*H04L 17/02* (2006.01)

(52) U.S. Cl. ........................................ 341/176

(58) Field of Classification Search .................... 341/176
See application file for complete search history.

(56) References Cited

U.S. PATENT DOCUMENTS 7,256,726 B2 * 8/2007 Bejean ........................ 341/176

2009/0002217 A1 * 1/2009 Kryze et al. ................... 341/176
2011/0012835 A1 * 1/2011 Hotelling et al. ............ 345/163

FOREIGN PATENT DOCUMENTS

| JP | 10-59131 | 3/1998 |
| JP | 2000-308159 A | 11/2000 |
| JP | 2001-325858 A | 11/2001 |
| JP | 2007-104204 A | 4/2007 |

* cited by examiner

*Primary Examiner* — Rexford Barnie
*Assistant Examiner* — Dru Parries
(74) *Attorney, Agent, or Firm* — Cantor Colburn LLP

(57) ABSTRACT

A remote controller has at least one input switch, and transmits a signal based on a state of the input switch to a target object. A main electrode pair is arranged as the input device and is configured such that inter-electrode distance varies in accordance with a pressing force. Plural sub electrode pairs are each arranged at positions different from the main electrode pair and are configured such that inter-electrode distance varies in accordance with a pressing force. The signal processor monitors a capacitance value of the main electrode pair and the plural sub electrode pairs, and performs predetermined signal processing in accordance with the capacitance value that has been detected. A transmitter transmits a control signal in accordance with the capacitance value of the main electrode pair to the target object.

4 Claims, 4 Drawing Sheets

REMOTE CONTROL APPARATUS USING ELECTROSTATIC SENSOR

BACKGROUND OF THE INVENTION

1. Field of the Invention

The present invention relates to devices provided with an electrostatic sensor as an input apparatus.

2. Description of the Related Art

A remote control apparatus (referred to below as "remote controller") is used for remote control of target objects that are located at a distance from a user, such as a television set, an audio device, or an air conditioner. In recent years there has been progress to the extent of using a remote control key for locking and unlocking an automobile, and even for starting an engine.

In general a remote controller is provided with an operating part including a button or switch that receives a user's instruction input, and a transmitter that encodes the instruction input which has been inputted through the operating part, and modulates a light beam, an infra-red ray, or a radio wave, to be transmitted to the target object. Conventional operating parts have generally monitored contact and non-contact of electrodes by a mechanical switch.

However, with the mechanical switch there is a problem in that wear occurs due to repeated pressing. Also, when the mechanical switch is installed in a remote controller, there has been a problem of water resistance due to a gap occurring between a moving part of the switch, that is, the button, and a casing. This problem is particularly significant for an automobile remote control key that is used outdoors.

In recent years, instead of the mechanical switch an electrostatic sensor has begun to be used. The electrostatic sensor is a device in which the distance between two electrodes that are arranged opposite each other is changed by the electrodes being pressed, and change of electrostatic capacitance is used to detect and analyze input from the user. For example, Patent Document 1 discloses an input device that uses this change of electrostatic capacitance of an electrode pair.

The electrostatic sensor has excellent durability in comparison to the mechanical switch, and since it can be installed inside a hermetically sealed casing, it is also excellent from the point of view of water resistance. Consequently, there have been various efforts to install the electrostatic sensor in remote controllers and electronic devices.

Patent Document 1: Japanese Patent Application, Laid Open No. 2001-325858

Patent Document 2: Japanese Patent Application, Laid Open No. 2000-308159

Patent Document 3: Japanese Patent Application, Laid Open No. 2007-104204

Patent Document 4: Japanese Patent Application, Laid Open No. H10-59131

The electrostatic sensor performs detection by converting electrostatic capacitance to voltage. Therefore, since there is a need to constantly monitor the electrostatic capacitance in order to judge a state of operation input by the user, it is necessary to constantly operate a circuit that converts the electrostatic capacitance to an electrical signal, and there is a problem in that power consumption increases in comparison to the mechanical switch. Furthermore, taking an automobile remote controller as an example, if a switch that is in a pocket or a bag is unintentionally pressed, a target object will be operated by mistake.

This type of problem is not limited to remote controllers, and may occur in various types of electronic device in which an operating part of an electrostatic sensor is provided on a surface of the casing.

SUMMARY OF THE INVENTION

The present invention has been made in view of these types of problem, and a general purpose thereof is to provide control technology for a remote controller or electronic device, and for a switch, which can solve at least one of the above-mentioned problems by flexible control.

1. An embodiment of the present invention relates to a remote control apparatus that has at least one input device, and that transmits a signal based on an input state of the input device to a target object. The remote control apparatus is provided with a main electrode pair arranged as the input device and configured such that inter-electrode distance varies in accordance with a pressing force; a sub electrode pair arranged at a position different from the main electrode pair and configured such that inter-electrode distance varies in accordance with a pressing force; a signal processor that monitors capacitance value of the main electrode pair and the sub electrode pair and performs predetermined signal processing in accordance with a capacitance value that is detected; and a transmitter that transmits a control signal in accordance with a capacitance value of the main electrode pair, generated by the signal processor, to the target object.

According to this embodiment, by providing, separately from the main electrode pair arranged as a conventional switch for operating the target object, the sub electrode pair provided with no relation to operation of the target object, and performing processing in accordance with a state of the main electrode pair and the sub electrode pair, it is possible to perform flexible control. Furthermore, since the sub electrode pair is disposed at a position different from the main electrode pair, it is possible to reduce the probability of unintentionally pressing them at the same time and of mistaken input being detected.

In a state in which a user of the remote control apparatus is holding a casing in his/her hand for normal usage, the sub electrode pair may be disposed at a position that is pressed by being in contact with the hand.

In such cases, when the user holds the casing, since capacitance of the sub electrode pair has a predetermined state according to the pressing force, it is possible to preferably detect that the casing is being held by the user.

The main electrode pair may be arranged on a first face of the casing of the remote control apparatus, and the sub electrode pair may be arranged on a different face from the first face of the casing.

The signal processor monitors only capacitance of the sub electrode pair, and when a state in which the sub electrode pair has been pressed is detected, may start monitoring of the main electrode pair.

In such cases, since there is no need to monitor the capacitance of the main electrode pair before the sub electrode pair is pressed, it is possible to reduce power consumption.

A plurality of sub electrode pairs may be provided. The signal processor monitors only capacitance of the plurality of sub electrode pairs, and when a state is detected in which at least two of the sub electrode pairs have been pressed, may start monitoring of the main electrode pair.

If a plurality of sub electrodes is used, it is possible to improve detection accuracy of a state in which the casing is being held by the user.

The signal processor may intermittently execute a monitoring state and a non-monitoring state of a sub electrode pair.

The monitoring of the sub electrode pairs can be used to judge whether or not the user is holding the apparatus in his/her hand. In general, from the user taking the remote controller in his/her hand to performing an operation by the input device, there is a time lag of at least several 10s of ms, to several 100s of ms. Therefore, when monitoring of the capacitance of the sub electrode pairs is performed intermittently, it is possible to preferably reduce the power consumption without the user perceiving a delay in processing.

When the signal processor detects a pressing force on the main electrode pair, in a state in which the sub electrode pair is pressed, predetermined signal processing may be executed.

In such cases, it is possible to prevent the target object from operating by mistake due to mistaken input.

A plurality of sub electrode pairs is provided, and when the signal processor detects a pressing force on the main electrode pair, in a state in which all the sub electrode pairs are pressed, predetermined signal processing may be executed.

The plurality of sub electrode pairs are provided, and at least one may be disposed on a second face different from the first face of the casing, and another one may be disposed on a third face different from the first and the second face.

Another embodiment of the present invention relates to an electronic device that has at least one input device. The electronic device is provided with a main electrode pair arranged as the input device and configured such that inter-electrode distance varies in accordance with a pressing force; a sub electrode pair arranged at a position different from the main electrode pair and configured such that inter-electrode distance varies in accordance with a pressing force; and a signal processor that monitors capacitance value of the main electrode pair and the sub electrode pair and performs predetermined signal processing in accordance with a capacitance value that is detected.

In a state in which a user of the electronic device is holding a casing in his/her hand for normal usage, the sub electrode pair may be disposed at a position that is pressed by being in contact with the hand.

The signal processor monitors only capacitance of the sub electrode pair, and when a state in which the sub electrode pair has been pressed is detected, may start monitoring of the main electrode pair.

The electronic device may be a communication terminal, and the sub electrode pair may be disposed at a position that is pressed by being in contact with a user's head, in a state in which the user of the communication terminal brings the casing close to an ear in order to communicate.

In a state in which the sub electrode pair is pressed, the signal processor may nullify a result of detecting a pressing force on the main electrode pair.

An even further embodiment of the present invention relates to a method of controlling a switch, arranged on a casing held by a user's hand in a normal usage state, and having an electrode pair configured such that inter-electrode distance varies in accordance with a pressing force. This method includes monitoring a capacitance value of a sub electrode pair provided separately from the electrode pair of the switch, monitoring a capacitance value of the electrode pair of the switch, and judging input to the switch when the capacitance value of the sub electrode pair satisfies a predetermined condition, and the capacitance value of the electrode pair of the switch satisfies a predetermined condition.

2. An embodiment of the present invention relates to a remote control apparatus that has at least one input device, and that transmits a signal based on an input state of the input device to a target object. The remote control apparatus is provided with a main electrode pair arranged as the input device and configured such that inter-electrode distance varies in accordance with a pressing force; a sub electrode pair configured such that inter-electrode distance varies in accordance with a pressing force; a signal processor that monitors capacitance of the main electrode pair and the sub electrode pair and performs predetermined signal processing in accordance with a capacitance value that is detected, and a transmitter that transmits a control signal in accordance with a capacitance value of the main electrode pair, generated by the signal processor, to the target object. The signal processor changes a monitoring state of the main electrode pair, in accordance with a capacitance value of the sub electrode pair.

According to this embodiment, in cases in which there is no need to monitor the main electrode pair, in accordance with a pressing state of the sub electrode pair, it is possible to stop or to reduce the frequency of this monitoring, and it is possible to reduce power consumption.

The signal processor monitors only capacitance of the sub electrode pair, and when a capacitance value of the sub electrode pair satisfies a predetermined condition, may start monitoring of the main electrode pair.

When only the capacitance of the sub electrode pair is monitored, the signal processor may intermittently repeat a monitoring state and a non-monitoring state.

A period of a monitoring state and a period of a non-monitoring state may be capable of being set from outside.

In a state in which a user of the remote control apparatus is holding a casing in his/her hand for normal usage, the sub electrode pair may be disposed at a position that is pressed by being in contact with the hand.

In such cases, when the user holds the casing, since the capacitance of the sub electrode pair has a predetermined state according to the pressing force, it is possible to preferably detect that the casing is being held by the user.

Another embodiment of the present invention relates to an electronic device that has at least one input device. The electronic device is provided with a main electrode pair arranged as the input device and configured such that inter-electrode distance varies in accordance with a pressing force; a sub electrode pair configured such that inter-electrode distance varies in accordance with a pressing force; and a signal processor that monitors capacitance of the main electrode pair and the sub electrode pair and performs predetermined signal processing in accordance with a capacitance value of the main electrode pair, that is detected. The signal processor changes a monitoring state of the main electrode pair, in accordance with the capacitance value of the sub electrode pair.

The signal processor monitors capacitance of only the sub electrode pair, and when a capacitance value of the sub electrode pair satisfies a predetermined condition, may start monitoring of capacitance of the main electrode pair.

When only the capacitance of the sub electrode pair is monitored, the signal processor may intermittently repeat a monitoring state and a non-monitoring state.

In a state in which a user of the electronic device is holding a casing in his/her hand for normal usage, the sub electrode pair may be disposed at a position that is pressed by being in contact with the hand.

An even further embodiment of the present invention relates to a method of controlling a switch, arranged on a casing held by a user's hand in a normal usage state, and having an electrode pair configured such that inter-electrode distance varies in accordance with a pressing force. This method includes monitoring a capacitance value of a sub electrode pair configured such that inter-electrode distance varies in accordance with a pressing force, and starting monitoring of a capacitance value of the electrode pair of the switch when the capacitance value of the sub electrode pair satisfies a predetermined condition, and executing predetermined processing when the capacitance value of the electrode pair of the switch satisfies a predetermined condition.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, "a state in which a member A is connected to a member B" includes cases in which the member A and the member B are directly and physically connected, and cases in which the member A and the member B are indirectly connected via another member that does not affect an electrical connection state. Similarly, "a state in which a member C is arranged between a member A and a member B" includes, in addition to cases in which the member A and the member C or the member B and the member C are directly connected, cases in which the members are indirectly connected via another member that does not affect an electrical connection state.

Figure 1:
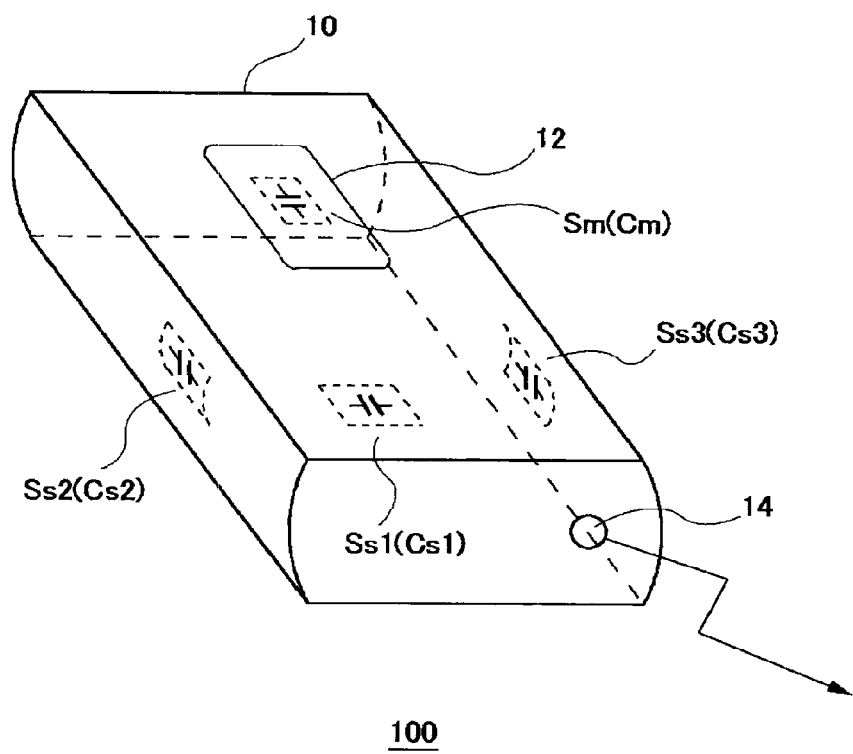
FIG. 1 is a block diagram showing a configuration of a remote controller according to an embodiment.

FIG. 1 is a block diagram showing a configuration of a remote controller 100 according to an embodiment. The remote controller 100 is, for example, a remote controller for an automobile, and in a casing 10 thereof, an input device (referred to below as an input switch) 12 is provided for controlling locking and unlocking a door and opening and closing of a window. When a user presses the input switch 12 with a finger, information indicating a state of the input switch 12 is converted into a signal such as a light beam, an infra-red ray, a radio wave, or the like, to be transmitted to the automobile, which is a target object, from a transmitter 14, and the target object performs a predetermined operation.

The remote controller 100 according to the present embodiment is provided, not with a mechanical switch, but with a sensor (referred to as an electrostatic sensor) that uses electrostatic capacitance, as the input switch 12. The remote controller 100 may be provided with a plurality of input switches 12 to which different functions are assigned.

In addition to the electrostatic sensor Sm provided as the input switch and a transmitter 14, the remote controller 100 is provided with a plurality of electrostatic sensors Ss1, Ss2, and Ss3. A detailed description is given later, but each of the electrostatic sensors Sm and Ss1 to Ss3 is provided with an electrode pair configured such that inter-electrode distance varies in accordance with added pressure, and a detection circuit for detecting a capacitance value of the electrode pair.

Below, as necessary, distinctions are made by referring to the electrostatic sensor Sm as a main sensor, and the electrostatic sensors Ss1 to Ss3 as first to third sub sensors. Furthermore, the electrode pair provided in the main sensor Sm is referred to as a main electrode pair Cm, and the electrode pairs provided in the sub sensors Ss1 to Ss3 are referred to as first to third sub electrode pairs Cs1 to Cs3.

The main sensor Sm and the sub sensors Ss1 to Ss3 shown in FIG. 1 show approximate positions of the main electrode pair Cm and the sub electrode pairs Cs1 to Cs3 respectively arranged thereon. The detection circuits (not illustrated in the drawings) for the capacitances, provided in the main sensor Sm and the sub sensors Ss1 to Ss3 are integrated as units with circuits for processing detection results.

As shown in FIG. 1, the plurality of sub electrode pairs Cs1 to Cs3 is arranged at different positions from the main electrode pair Cm.

"Different positions" includes (1) being disposed on different faces of the casing, (2) being disposed at positions separated by at least 1 cm, (3) an angle formed by the main electrode pair and a sub electrode pair, with a center point of a cross-section of the casing including the main electrode pair and the sub electrode pair as an apex, being 75 degrees or more, and (4) being disposed separated by at least ⅕ of an outer circumference of a cross-section of the casing including the main electrode pair and the sub electrode pair. Stated from another viewpoint, "different positions" refers to a positional relationship such that when a user presses a main electrode with a thumb, the sub electrode pairs are not pressed by that thumb.

Specifically, in a state in which a user of the remote controller 100 is holding the casing 10 in his/her hand for normal usage, that is, for the purpose of operating the input switch 12, the plurality of sub electrode pairs Cs1 to Cs3 are disposed at positions that are pressed by being in contact with the hand.

The positional relationship of the main electrode pair Cm and the sub electrode pairs Cs is preferably determined as follows.

(1) As shown in FIG. 1, when the casing 10 is formed of a multi-faced unit, the plurality of sub electrode pairs Cs1 to Cs3 are arranged on faces different from the main electrode pair Cm. In the remote controller 100 of FIG. 1, the main electrode pair Cm is arranged on an upper face (first face) of the casing 10, and the sub electrode pairs Cs1 to Cs3 are arranged on two side faces touching the upper face, and a bottom face. Each of the electrode pairs is arranged on an inner side of the faces of the casing.

The casing 10 is formed by curved faces, and in cases of not being able to design a plurality of faces, the positions of the main electrode pair Cm and the sub electrode pairs Cs1 to Cs3 may be determined based on at least one of the following conditions (2) to (4).

(2) The sub electrode pairs Cs may be disposed to be separated by 1 cm or more on an upper face of the casing, from the main electrode pair Cm. By a separation of 1 cm or more, and preferably about 3 cm, it is possible to reduce the probability of unintentionally pressing at the same time.

(3) For descriptive purposes, consideration is given to a center point of a cross-section of the casing 10 including a certain sub electrode pair Cs and the main electrode pair Cm. At this time, with a center point as an apex, an angle formed by this sub electrode pair Cs and the main electrode pair Cm is desirably 75 degrees or more, and more preferably 90 degrees or more. An angle of 180 degrees means that the sub electrode pair Cs is disposed on a side opposing the main electrode pair Cm, with the casing 10 in between.

(4) Consideration is given to a cross-section of the casing 10 including the sub electrode pair Cs and the main electrode pair Cm. At this time the main electrode pair Cm and the sub electrode pair Cs are disposed to be separated by ⅕ or more of an outer circumference of this cross-section.

Figure 2:
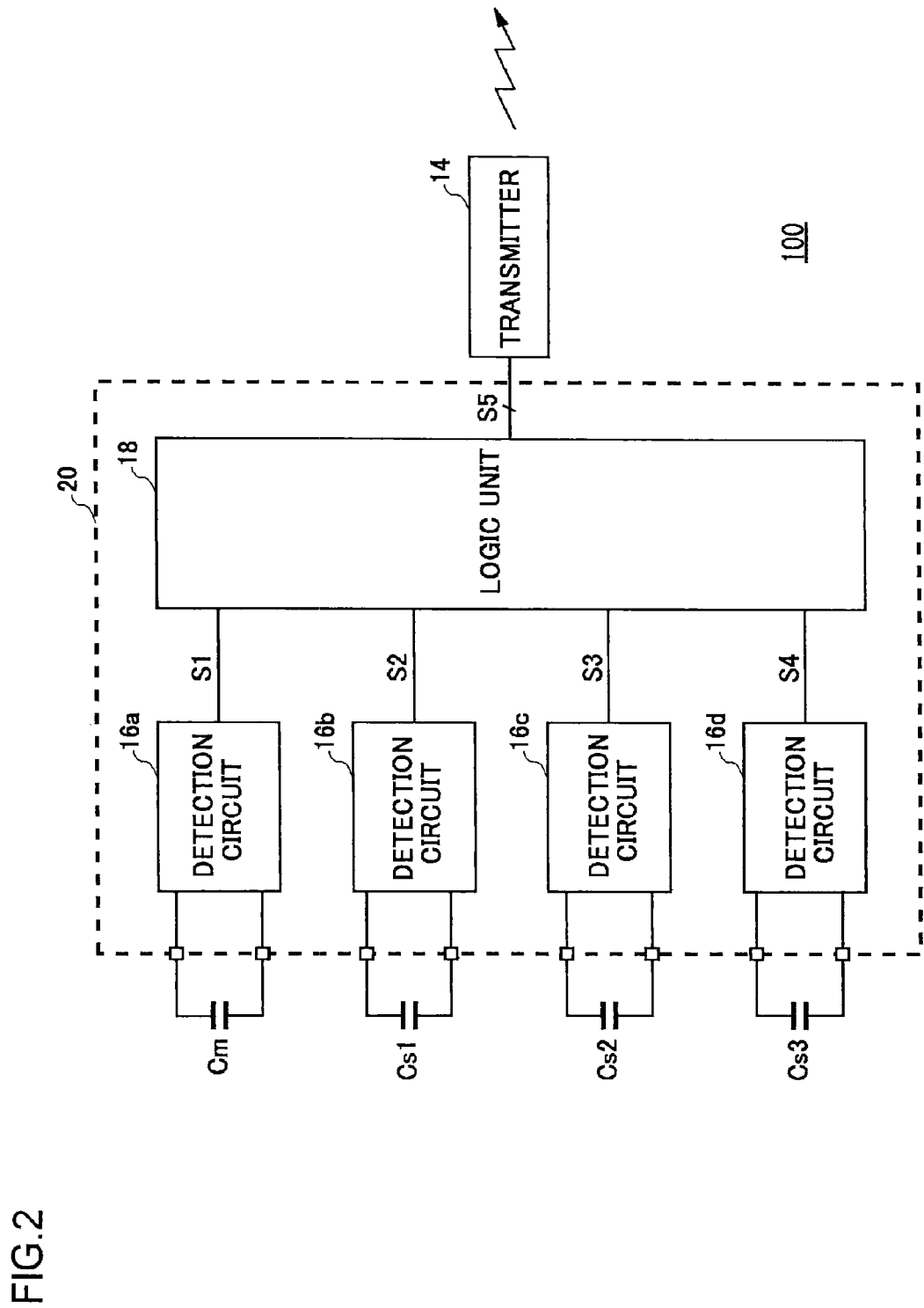
FIG. 2 is a drawing showing a functional block diagram of the remote controller of FIG. 1.

FIG. 2 shows a functional block diagram of the remote controller 100. The remote controller 100 is provided with the main electrode pair Cm, the sub electrode pairs Cs1 to Cs3, the signal processor 20, and the transmitter 14.

The signal processor 20 monitors capacitance values of the main electrode pair Cm and the sub electrode pairs Cs1 to Cs3, and performs predetermined signal processing in accordance with a detected capacitance value.

The signal processor 20 includes detection circuits 16a to 16d and a logic unit 18. The signal processor 20 may be integrated as a unit on one semiconductor substrate. The detection circuit 16a and the main electrode pair Cm form the abovementioned main sensor Sm, and the detection circuits 16b to 16d, together with the corresponding sub electrode pairs Cs1 to Cs3, respectively form the sub sensors Ss1 to Ss3. The detection circuits 16a to 16d respectively measure capacitances of the corresponding electrode pairs Cm and Cs1 to Cs3. For example, the detection circuits 16a to 16d are configured from a capacitance voltage conversion circuit (C/V conversion circuit) and an A/D converter which converts voltage to a digital signal in accordance with the converted capacitance. However, configurations of the detection circuits 16a to 16d are not limited thereto. The detection circuits 16a to 16d output detection signals S1 to S4 in accordance with the capacitance values of corresponding electrode pairs.

The detection signals S1 to S4 in accordance with the capacitance values are inputted to the logic unit 18. The detection signals S1 to S4 change when the corresponding electrode pairs Cm and C1 to C3 are pressed. The logic unit 18 generates a control signal S5 in accordance with the capacitance value of the main electrode pair Cm, and outputs to the transmitter 14 of a later stage. The transmitter 14 receives the control signal S5, converts the signal to a light beam, an infra-red ray, a radio wave, or the like, and transmits to a receiver on an automobile, which is to be controlled.

According to the abovementioned configuration, besides the main electrode pair Cm provided as a basic switch for operating the target object, the sub electrode pairs Cs1 to Cs3 arranged having no relation to operation of the target object are provided, and by performing processing in accordance with a state of the main electrode pair Cm and the sub electrode pair Cs1 to Cs3, it is possible to perform flexible control. Furthermore, since the sub electrode pairs Cs1 to Cs3 are disposed at positions different from the main electrode pair Cm, it is possible to reduce the probability of electrodes being pressed unintentionally at the same time, and mistaken input being detected.

Below, a description is given concerning a specific example of flexible processing made possible by providing the sub electrode pairs Cs1 to Cs3.

The detection circuits 16a to 16d are configured such that each of them can be independently switched to be active or inactive (ON or OFF), and a state of monitoring or of not monitoring the capacitance of corresponding electrode pairs can be switched. The signal processor 20 changes a monitoring state of the main electrode pair Cm in accordance with the capacitance values of the sub electrode pairs Cs1 to Cs3. That is, an operation state of the detection circuit 16a is changed in accordance with the capacitance values of the sub electrode pairs Cs1 to Cs3.

The signal processor 20, in a standby state monitors only the capacitance of the sub electrode pairs Cs1 to Cs3. As a result, when the capacitance values of the sub electrode pairs Cs1 to Cs3 satisfy a predetermined condition, there is a transition to a normal monitoring state, and monitoring of the main electrode pair Cm is started. The predetermined condition is, for example, a state in which any one of the sub electrodes is pressed, a state in which at least two of the sub electrodes are pressed, a state in which a combination of two specified sub electrode pairs are pressed, a state in which all the sub electrode pairs are pressed, or the like. A state in which a sub electrode pair is pressed assumes a state in which the user is holding the casing 10 in his/her hand. In other words, since the probability that the user is holding the casing 10 is low before the sub electrode pairs Cs1 to Cs3 are pressed, the probability that monitoring of the main electrode pair Cm is unnecessary is high. Consequently, monitoring of the main electrode pair Cm is not performed before the sub electrode pairs Cs1 to Cs3 are pressed, and the signal processor 20 makes the detection circuit 16a inactive and reduces power consumption.

In a standby state, instead of the detection circuit 16a being constantly inactive, by intermittently alternately repeating an active (monitoring) state and an inactive (non-monitoring) state, power consumption may be reduced. In cases of intermittent operation, power consumption increases a little in comparison to cases of being constantly inactive, but, irrespective of whether the user is holding the casing 10, even in cases in which capacitance changes of the sub electrode pairs Cs1 to Cs3 have not satisfied the predetermined condition, it is possible to detect pressing of the main electrode pair Cm. However, in such cases, since response of detection of an operation on the input switch 12 is lowered, this may be referred to as exceptional processing.

Seen from another viewpoint, the sub electrode pairs Cs1 to Cs3 can act for a switch for starting the detection circuit 16.

In order to further reduce the power consumption, in a standby state, with the detection circuits 16b to 16d intermittently active, a monitoring state and a non-monitoring state are alternately repeated. For example, by arranging a monitoring period of several ms to several tens of ms, once every few seconds, the power consumption can be preferably reduced. The few seconds may be set according to a period required from the user taking the casing 10 in his/her hand to pressing the input switch 12, and this period is experimentally 1 to 2 seconds and about 3 seconds at longest. This may be further lengthened to about 5 seconds, but since the longer the period is, instead of being able to reduce the power consumption, a time lag until the detection circuit 16a becomes active occurs, and it is felt that the response is bad. It is desirable that a period of a monitoring state period and a period of a non-monitoring state be capable of being set.

Monitoring states of the main electrode pair Cm of the detection circuit 16a are illustrated below.

1. Monitoring Stopped State

A state in which monitoring of the capacitance value of the main electrode pair Cm is stopped, and power consumption is minimized.

2. Low Speed Monitoring State

A state in which the capacitance value of the main electrode pair Cm is monitored intermittently. A monitoring period of several ms to several tens of ms, once every 0.1 to 1 seconds is arranged.

3. High Speed Monitoring State

A state in which a monitoring period of several ms is repeated with a short interval, or continuously. The power consumption is large, but detection time lag is shortest.

Figure 3:
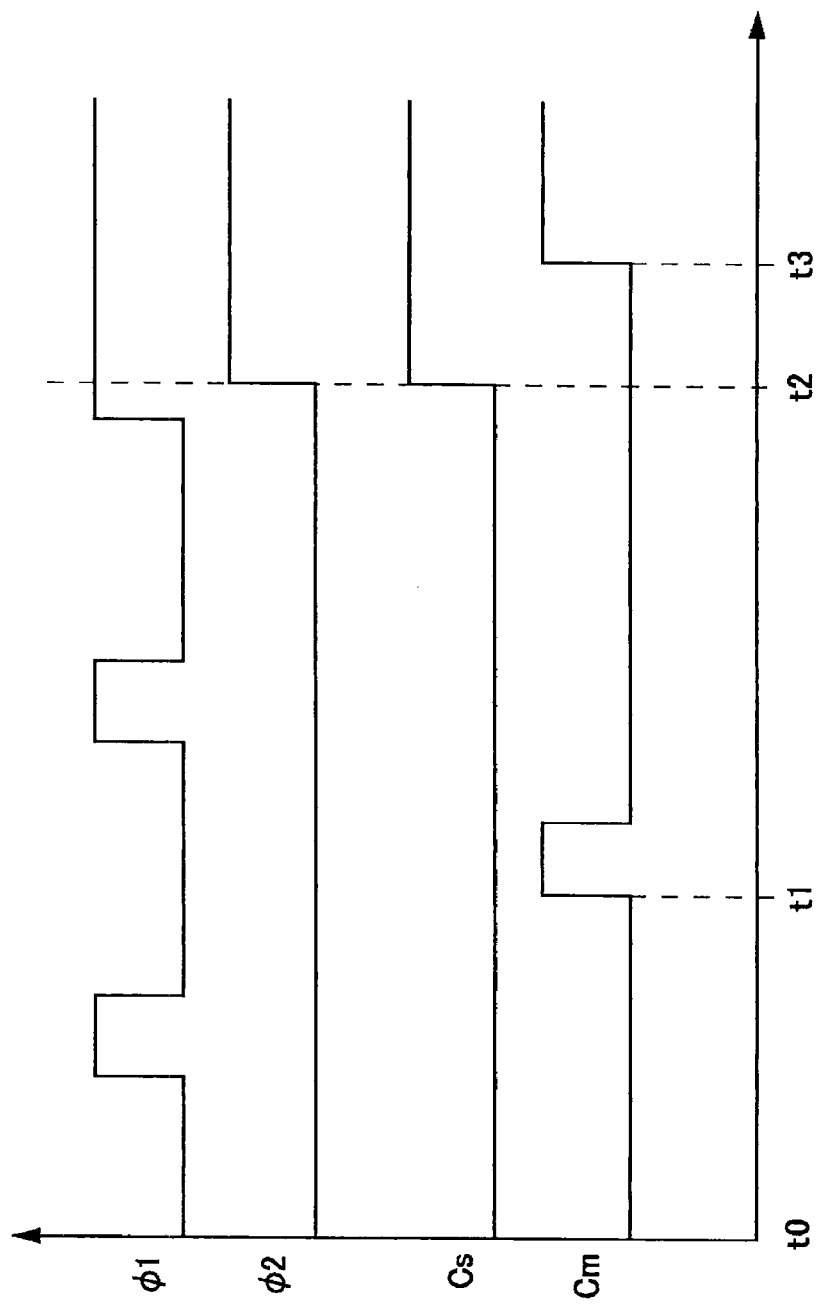
FIG. 3 is a time chart showing an operation state of the remote controller of FIG. 1.

FIG. 3 is a time chart showing an operation state of the remote controller 100. In this time chart, φ1 indicates an operation state of the detection circuits 16b to 16d; φ2 indicates an operation state of the detection circuit 16a; Cs indicates a result of a condition judgment of a capacitance value of the sub electrode pairs Cs; and Cm indicates a pressing state of the main electrode pair Cm. With regard to the operation states φ1 and φ2 of the detection circuits, a high level indicates a monitoring state, and a low level indicates a non-monitoring state. With regard to Cs, a high level indicates a state in which a condition is satisfied. With regard to Cm, a high level indicates a pressing state.

A period from time t0 to t2 is a standby state, and the capacitance values of the sub electrode pairs Cs1 to Cs3 are intermittently monitored by the detection circuits 16b to 16d. During this time, the detection circuit 16a is in a monitoring stopped state.

Even if the main electrode pair Cm is pressed at time t1 before time t2, since the detection circuit 16a is in a monitoring stopped state, a pressing operation is not detected.

At time t2 if the user is holding the casing 10, the capacitance values of the sub electrode pairs Cs1 to Cs3 change and a predetermined condition is satisfied. After time t2, the detection circuit 16a transitions to a low speed monitoring state or a high speed monitoring state, and a state of the input switch 12, that is, the capacitance value of the main electrode pair Cm is monitored. At time t3, if the user presses the main electrode pair Cm, this information is transmitted from the transmitter 14.

By the above processing, the power consumption before the user is holding the casing 10 can be reduced. Furthermore, in a state in which a sub electrode pair Cs is pressed, when it is detected that the main electrode pair Cm is pressed, predetermined signal processing is executed. In other words, in a state in which the casing 10 of the remote controller 100 is held in the hand, when the input switch 12 is first operated, locking, unlocking, or window control of an automobile that is to be controlled, is performed. As a result, it is possible to preferably prevent a mistaken operation in a state in which the remote controller 100 is in a bag or a pocket.

A description has been given above concerning configuration and operation of the remote controller 100 according to an embodiment. The embodiment is an example, and a person skilled in the art will understand that various modified examples in combinations of various component elements and various processes thereof are possible, and that such modified examples are within the scope of the present invention.

A modified example is described below. Control technology of an input device using an electrostatic sensor according to an embodiment is not limited to a remote controller 100, and can be used in other electronic devices. The electronic devices include, for example, mobile phones, PDA (Personal Digital Assistants), portable music players, and the like.

Figure 4:
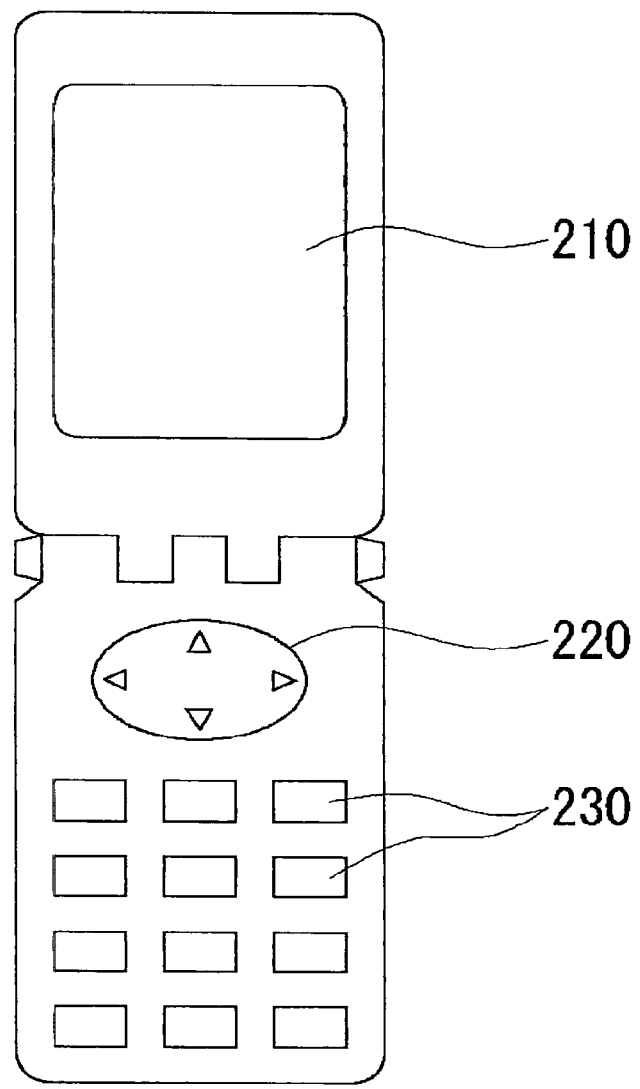
FIG. 4 is a drawing showing a mobile communication terminal in which an input device using an electrostatic sensor is installed.

In cases in which an input device using the electrostatic sensor is installed in an electronic device, several technologies described with the remote controller 100 as an example can be preferably put to other uses. Below, as an electronic device, a mobile communication terminal or the like is described as an example. FIG. 4 is a drawing showing a mobile communication terminal 200 in which the input device is installed. The mobile communication terminal 200 is provided with a display 210, an input device 220, and operation buttons 230.

The display 210 displays various necessary information to a user. The input device 220 is a joystick type of input device that is operated by the user's finger, and is provided so that, by applying pressure in each of top, left, bottom, and right directions, a selection is made of items or objects displayed on the display 210, or assistance is provided in text input. The operation buttons 230 form an input device provided for inputting a telephone number when making a call, and for inputting text.

The input device 220 and the operation buttons 230 are configured using the electrostatic sensor. That is, the input device 220 and the operation buttons 230 include a main electrode pair Cm. At locations separated from this, sub electrode pairs Cs are arranged. In addition, the mobile communication terminal 200 is provided with a signal processor 20 as in FIG. 2.

In cases, for example, in which the sub electrodes Cs are arranged on a rear face of the mobile communication terminal 200, that is, on a face opposite to a face on which the display 210 and the input device 220 are arranged, by monitoring a pressing state of the sub electrodes Cs, a judgment can be made as to whether or not the user is holding the mobile communication terminal 200. When it is judged that the mobile communication terminal is being held by the user, if the main electrodes Cm of each of the input device 220 and the operation buttons 230 are monitored, it is possible to reduce the power consumption.

Conversely, in a state in which the sub electrodes Cs are pressed, monitoring of capacitance value of a certain main electrode pair Cm may be stopped or nullified. When the mobile communication terminal 200 is being used in a telephone call, the input device 220 or the operation buttons 230 may be in contact with the user's head and, in particular, an ear or cheek, and may be pressed so that unnecessary input is recognized.

Consequently, another sub electrode pair Cs may be disposed at a location that is pressed by being in contact with the user's head, in a state in which the casing is close to an ear when the user of the mobile communication terminal 200 is making a telephone call. By monitoring the capacitance value of these sub electrodes Cs, it is possible to judge whether or not the user is making a telephone call. When it is judged that the user is making a telephone call, monitoring of the capacitance of the main electrodes Cm of either or both of the input device 220 or the operation buttons 230 may be stopped. Alternatively, the capacitance of the main electrode pair Cm is monitored, but inputted information may be discarded and nullified.

According to this modified example also, similar to the remote controller 100 of the embodiment, by providing the sub electrode pair Cs, and combining a pressing state thereof and a pressing state of the main electrode pair Cm to perform signal processing, flexible control is possible.

While the preferred embodiments of the present invention have been described using specific terms, such description is for illustrative purposes only, and it is to be understood that changes and variations may be made without departing from the spirit or scope of the appended claims.

What is claimed is:

1. An electronic device that has at least one input device, the electronic device comprising:
   a main electrode pair arranged as the input device and configured such that inter-electrode distance varies in accordance with a pressing force;
   a first sub electrode pair arranged at a position different from the main electrode pair and configured such that inter-electrode distance varies in accordance with a pressing force; and
   a signal processor that monitors capacitance value of the main electrode pair and the first sub electrode pair and performs predetermined signal processing in accordance with the capacitance value that is detected, wherein
   the electronic device is a communication terminal, and
   the first sub electrode pair is disposed at a position where the first sub electrode is pressed by being in contact with a user's head, in a state in which a user of the communication terminal brings a casing close to an ear in order to communicate.

2. The electronic device according to claim 1 further comprising:
   a second sub electrode pair disposed at a position where the second sub electrode pair is pressed by being in contact with a hand of a user of the remote control apparatus in a state in which the user is holding a casing of the remote control apparatus in his/her hand for normal usage.

3. The electronic device according to claim 1, wherein the signal processor monitors only capacitance of the second sub electrode pair, and when a state is detected in which the second sub electrode pair has been pressed, starts monitoring of the main electrode pair.

4. The electronic device according to claim 1, wherein in a state in which the first sub electrode pair is pressed, the signal processor nullifies a result of detecting a pressing force on the main electrode pair.

* * * * *